United States Patent
Corwin et al.

(10) Patent No.: US 10,466,290 B2
(45) Date of Patent: Nov. 5, 2019

(54) AUTOMATED TEST AND MEASUREMENT SYSTEM WITH MAGNETIC FIELD DETECTION

(71) Applicant: INNOVAURA CORPORATION, Edmonds, WA (US)

(72) Inventors: Alan B. Corwin, Bremerton, WA (US); Keith Mullins, Kent, WA (US); Ronald J. Schoenberg, Burien, WA (US); C. MacGill Lynde, Bellevue, WA (US); David B. Goodson, Bellevue, WA (US); Christopher A. Wiklof, Everett, WA (US)

(73) Assignee: INNOVAURA CORPORATION, Edmonds, WA (US)

( * ) Notice: Subject to any disclaimer, the term of this patent is extended or adjusted under 35 U.S.C. 154(b) by 231 days.

(21) Appl. No.: 15/061,231

(22) Filed: Mar. 4, 2016

(65) Prior Publication Data

US 2017/0242062 A1 Aug. 24, 2017

Related U.S. Application Data (63) Continuation of application No. PCT/US2014/054432, filed on Sep. 5, 2014.
(Continued)

(51) Int. Cl.
*G01R 1/07* (2006.01)
*G01R 31/00* (2006.01)
(Continued)

(52) U.S. Cl.
CPC ............. *G01R 31/002* (2013.01); *G01R 1/07* (2013.01); *G01R 31/2834* (2013.01);
(Continued)

(58) Field of Classification Search
CPC ................................ G01R 31/002; G01R 1/07
(Continued)

(56) References Cited

U.S. PATENT DOCUMENTS 6,064,220 A 5/2000 Sugasawara et al.
7,560,920 B1 * 7/2009 Ouyang ............... G01N 27/902
324/240
(Continued)

FOREIGN PATENT DOCUMENTS

JP H07-83995 3/1995

OTHER PUBLICATIONS

PCT International Search Report and Written Opinion of International PCT Application No. PCT/US2014/054432 dated Sep. 29, 2014.
(Continued)

*Primary Examiner* — Reena Aurora
(74) *Attorney, Agent, or Firm* — Christopher A. Wiklof; Nicholas S. .Bromer; Launchpad IP, Inc.

(57) ABSTRACT

An automated circuit test system includes a magnetic sensor array configured to measure, at a plurality of locations, a magnetic field induced by a circuit under test. A circuit drive module can energize the circuit under test to induce the magnetic field. Optionally, the circuit drive module detects an electrical response from the circuit under test. Optionally, magnetic field data is combined with electrical response data prior to outputting the test result.

8 Claims, 7 Drawing Sheets

Related U.S. Application Data (60) Provisional application No. 61/874,202, filed on Sep. 5, 2013.

(51) Int. Cl.
| | | |
|---|---|---|
| *G01R 33/02* | (2006.01) | |
| *G01R 31/28* | (2006.01) | |
| *G01R 33/00* | (2006.01) | |
| *G01R 31/302* | (2006.01) | |
| *G01R 31/311* | (2006.01) | |
| *G01R 33/025* | (2006.01) | |
| *G01R 35/00* | (2006.01) | |
| *G01R 29/08* | (2006.01) | |

(52) U.S. Cl.
CPC ........ *G01R 31/3025* (2013.01); *G01R 31/311* (2013.01); *G01R 33/0035* (2013.01); *G01R 33/02* (2013.01); *G01R 33/025* (2013.01); *G01R 29/0878* (2013.01); *G01R 35/005* (2013.01)

(58) Field of Classification Search
USPC .......................................................... 324/244
See application file for complete search history.

(56) References Cited

U.S. PATENT DOCUMENTS

| | | | |
|---|---|---|---|
| 7,710,131 | B1 | 5/2010 | Tiernan |
| 2004/0222814 | A1 | 11/2004 | Kim et al. |
| 2005/0242804 | A1 | 11/2005 | Hintz et al. |
| 2005/0264306 | A1 | 12/2005 | Jung et al. |
| 2010/0308812 | A1 | 12/2010 | Marbler |

OTHER PUBLICATIONS

EPO Extended Search Report of EP Application No. 14842001.1 dated Apr. 7, 2017.

\* cited by examiner

AUTOMATED TEST AND MEASUREMENT SYSTEM WITH MAGNETIC FIELD DETECTION

CROSS-REFERENCE TO RELATED APPLICATIONS

The present application is a U.S. Continuation Application which claims priority benefit under 35 U.S.C. § 120 (pre-AIA) of co-pending International Patent Application No. PCT/US2014/054432, entitled "AUTOMATED TEST AND MEASUREMENT SYSTEM WITH MAGNETIC FIELD DETECTION", filed Sep. 5, 2014; which application claims priority benefit from U.S. Provisional Patent Application No. 61/874,202, entitled "AUTOMATED TEST AND MEASUREMENT SYSTEM WITH MAGNETIC FIELD DETECTION", filed Sep. 5, 2013, co-pending at the date of filing; each of which, to the extent not inconsistent with the disclosure herein, is incorporated by reference.

SUMMARY

Electronic circuits induce magnetic fields that extend away from the circuit. The magnetic fields can be detected using methods and apparatuses disclosed herein. The detected magnetic fields can be used to determine or infer circuit properties. According to embodiments, a detected induced magnetic field can be compared to one or more reference magnetic fields, and the comparison used to determine or infer individual circuit compliance or non-compliance with a manufacturing requirement and/or performance requirement.

According to embodiments, a magnetic sensor array provides an input modality to an automated circuit test analysis system. According to an embodiment, the magnetic sensor array can sense magnetic field emissions from an assembled and energized electronic circuit.

According to an embodiment, a circuit test system includes a magnetic sensor array configured to detect magnetic field strengths at a plurality of locations near an assembled electronic circuit and a magnetic field processor operatively coupled to receive magnetic field strength data from the magnetic sensor array and configured to transform the magnetic field strength data into a detected magnetic field pattern. The circuit test system includes a comparator processor operatively coupled to receive the detected magnetic field pattern from the magnetic field processor and configured to compare the detected magnetic field pattern to at least one reference magnetic field pattern. The comparator processor is configured to output electronic circuit test data indicative of correspondence of the detected magnetic field pattern to the reference magnetic field pattern.

According to an embodiment, a method for testing an electrical circuit includes outputting, via a data interface, a capture command to a magnetic sensor array arranged to receive magnetic signals emitted from an assembled electrical circuit, receiving, via the data interface, a plurality of magnetic field data values corresponding to respective magnetic sensors in the magnetic sensor array, converting the plurality of magnetic field data values into a detected magnetic field pattern, and comparing the detected magnetic field pattern to at least one reference magnetic field pattern. Electrical circuit test data and analysis data corresponding to the comparison between the detected magnetic field pattern and the reference magnetic field pattern is output.

According to an embodiment, a circuit test system includes a circuit energization apparatus (referred to as a circuit drive module, below) configured to energize a circuit under test. The energization apparatus can sequentially energize the circuit according to a predetermined series of voltage states. Current flowing through the circuit under test induces a detectable magnetic field pattern responsive to each voltage state. A magnetic sensor array can measure the magnetic field pattern induced by each of the predetermined series of states to produce a sequence of measured magnetic field patterns. An analysis system can correlate the sequence of measured magnetic field patterns to a condition of the circuit under test. According to embodiments, the analysis system compares the magnetic field pattern to one or more reference magnetic field patterns, and identifies divergence from normal. The inventors have correlated characteristic magnetic field deviations to known component performance problems. Accordingly, the system described herein can be used to identify circuit performance deviations and can determine, or at least narrow down, what component(s) may need replacement.

According to an embodiment, a magnetic measurement system includes a magnetic sensor array including a plurality of magnetic field sensing elements. A magnetic field processor, operatively coupled to the magnetic sensor array, can be configured to assemble and analyze a detected magnetic field pattern from magnetic sensor array data. Additionally, the magnetic measurement system may include a magnetic shield defining a magnetic aperture formed therethrough, the aperture being positioned to attenuate magnetic field strength formed by regions of a workpiece not corresponding to the magnetic aperture.

DETAILED DESCRIPTION

In the following detailed description, reference is made to the accompanying drawings, which form a part hereof. In the drawings, similar symbols typically identify similar components, unless context dictates otherwise. Other embodiments may be used and/or other changes may be made without departing from the spirit or scope of the disclosure.

Figure 1:
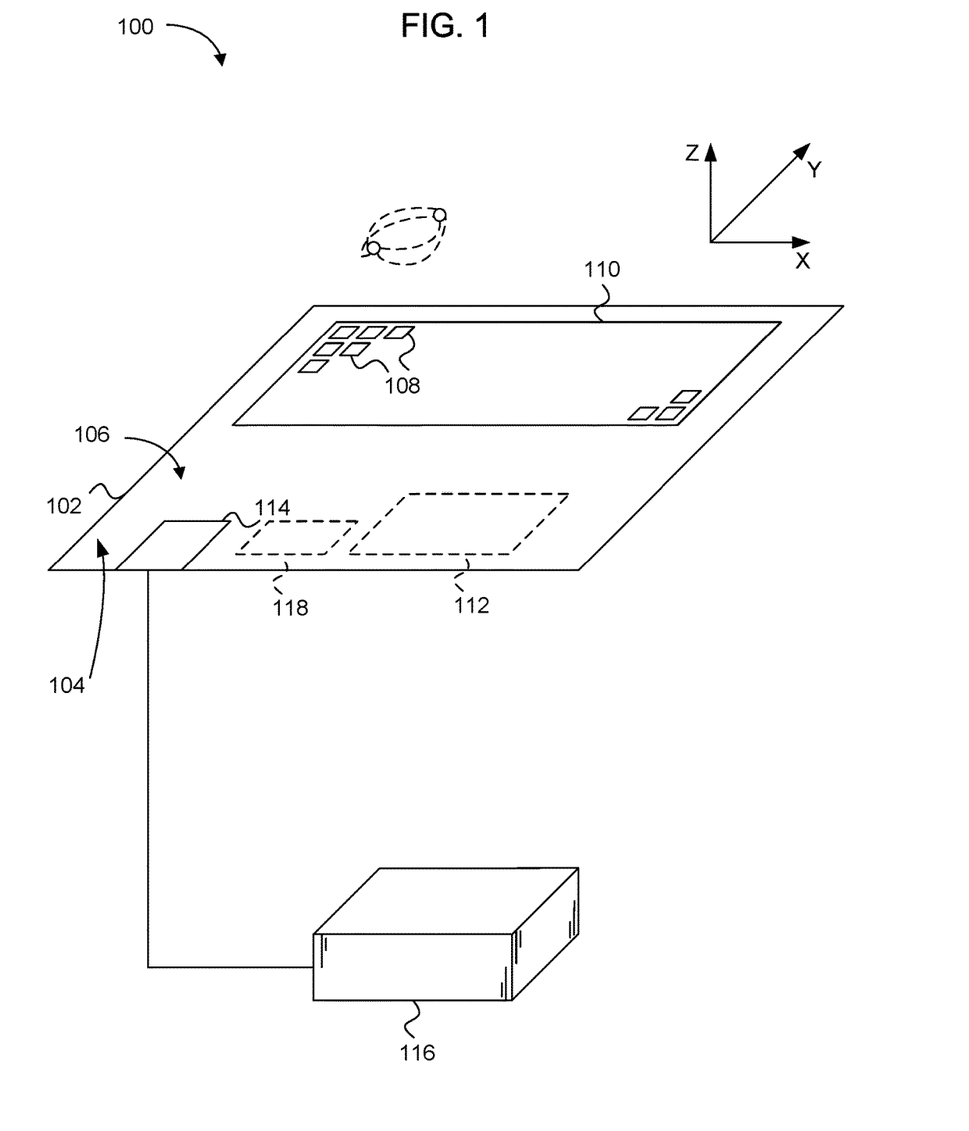
FIG. 1 is a depiction of a magnetic sensor array capture and processing system, according to an embodiment.

FIG. 1 is a depiction of a magnetic field pattern detection system 100, according to an embodiment. The magnetic field pattern detection system 100 includes a magnetic sensor subsystem on a substrate 102 with a top surface 104 and a bottom surface 106. A plurality of magnetic sensors 108 are arranged in an array 110. In the depicted embodiment, the magnet sensors 108 are disposed below or on the bottom surface 106 of the sensor substrate 102. A microcontroller 112 can be disposed on the sensor substrate 102 and configured to control sensing by the plurality of magnetic sensors 108. A data interface 114 operatively coupled to the microcontroller 112 provides data communications between the microcontroller 112 and a magnetic field analysis circuit 116.

The magnetic sensor subsystem can be configured to operate without cryogenic cooling. For example, the magnetic field pattern detection system 100 can be configured to operate at normal indoor ambient conditions with no cooling, with only conductive cooling, with only convective cooling, or with only conductive and convective cooling.

According to an embodiment, the magnetic sensors 108 include spintronic sensors. According to another embodiment, the magnetic sensors 108 include magneto-resistive sensors. According to another embodiment, the magnetic sensors 108 include magneto-inductive sensors. According to embodiments, the magnetic sensors 108 include non-cryogenically cooled sensors that have magnetic field sensitivity at least three orders of magnitude greater than the strength of the earth's magnetic field.

The magnetic sensor array 110 can include X-axis sensors configured to sense an X-axis magnetic field strength at each X-axis sensor location, Y-axis sensors configured to sense a Y-axis magnetic field strength at each Y-axis sensor location, and Z-axis sensors configured to sense a Z-axis magnetic field strength at each Z-axis sensor location. The plurality of magnetic sensors 108 can be arranged as sensor modules. Each sensor module can be configured to sense a magnetic field strength along each of three axes.

The microcontroller 112 can be configured to cause only one sensor module at a time to operate to sense the local magnetic field strength. The microcontroller 112 can be configured to suspend read and write operations when a sensor module is operating to sense the magnetic field strength. The microcontroller 112 can be configured to suspend read and write operations until an operating sensor module toggles an interface pin (not shown) on a serial peripheral interface (SPI) bus or until a timeout occurs.

The magnetic field pattern detection system can be configured to detect an electromagnetic image in about 100 milliseconds or less.

The data interface 114 can include a universal serial bus (usb) port. The magnetic sensor array can be configured as a peripheral on a usb port. The microcontroller 112 can be configured to disconnect continuity between a data line (not shown) of the usb port and power or ground (not shown) received from the usb port when the microcontroller 112 causes a magnetic sensor or magnetic sensor module to detect a perturbation in magnetic field.

Disconnecting a data line of the usb port from power or ground can be used to cause a host computer operating as the magnetic field analysis circuit 116 to cease data transmissions across the usb port. This can be useful for reducing the chance of signals conducted from the host computer from interfering with the electron spin detection.

The array of magnetic sensors can include a 2×2 array size or greater. In a particular set of embodiments, the array of magnetic sensors includes a 4×4 array size or greater. The magnetic sensors can be arranged in modules, with each module including multiple detection axes. The array can include an array of modules.

The microcontroller 112 can include an ARM Cortex M3 with boot ROM and RAM. According to an embodiment, the magnetic sensor subsystem can include a linear regulator configured to reduce 5V to 3.3V. The linear regulator can be shielded.

A sensor array selector (not shown), which can for example include an array of jumpers, can provide information to the microcontroller 112 about magnetic sensor array characteristics. For example, jumpers can be used to set the array size. This can allow for some sensor modules to not be populated.

The magnetic field analysis sub-system 116 can be configured to receive, from the microcontroller 112, a plurality of data values respectively corresponding to a magnetic field strength measured by each of the plurality of magnetic sensors 108, 204, 206, 208 and calculate a magnetic map corresponding to the plurality of data values. For example, the magnetic field analysis sub-system 116 can include a general-purpose computer configured to run a magnetic field pattern detection program. The general-purpose computer can include a tablet computer.

Each of the plurality of data values can include at least one value corresponding to a magnetic field strength along one axis.

Additionally and/or alternatively, each of the plurality of data values can include three values corresponding to a magnetic field strength along each of three axes. The magnetic field analysis circuit 116, when calculating the magnetic map, can be configured to combine the three values forming each of the plurality of data values to generate a corresponding plurality of vector lengths corresponding to magnetic field strengths across the magnetic sensor array 110. For example, the values can each be formed as data values b1, b2, and b3. The data values can be squared and added. A square root can be taken of the sum of the squares to produce a single data value B corresponding to local magnetic field strength. According to an alternative embodiment, a single data value B can alternatively be determined as a dot product of the data values b1, b2, and b3. According to an embodiment, each of the data values b1, b2, and b3 can be formed as three bytes of data.

In the case where individual sensors in the array respond slightly differently to the same magnetic field, it will be desirable to calibrate the sensors in the array. According to an embodiment, a calibration memory 118 is included on the magnetic field sensor subsystem. The calibration memory 118 includes correction data for individual sensors 108 in the sensor array 110. In one embodiment, the microcontroller 112 outputs a specific sensor 108 address with appended magnetic field strength data from the specific sensor to the calibration memory 118. The calibration memory receives the sensor address and magnetic field strength data from the sensor 108 as address data and outputs corrected data back to the microcontroller 112. In this way, the calibration memory 118 acts as a look-up table that can output corrected magnetic field strength data for any value received from the particular magnetic sensor 108.

In another embodiment, the calibration memory 118 is included in the magnetic field processor 116. In this embodiment, uncorrected data is transferred from the magnetic field sensor subsystem to the magnetic field processor 116, and the magnetic field processor 116 performs the correction for the particular magnetic sensors 108. According to an embodiment, the magnetic field sensor subsystem includes an addressable serial number. The serial number is used by the magnetic field processor 116 to access calibration data via a manufacturer's web site, from a memory device during set up, or is coded and paired with a particular magnetic field sensor subsystem during configuration. The sensor calibration data is loaded onto and carried by a physical memory on the magnetic field processor. Correction for measured data can be performed as described above.

Alternatively, the calibration data can include coefficients for an algorithm for scale and offset correction, for example.

According to an embodiment, a circuit test system includes a circuit energization apparatus configured to energize a circuit under test. The energization apparatus can sequentially energize the circuit according to a predetermined series of states. A magnetic sensor array can measure a magnetic field pattern induced by each of the predetermined series of states to produce a sequence of measured magnetic field patterns. An analysis system such as a comparator processor can correlate the sequence of measured magnetic field patterns to a condition of the circuit under test.

Figure 2A:
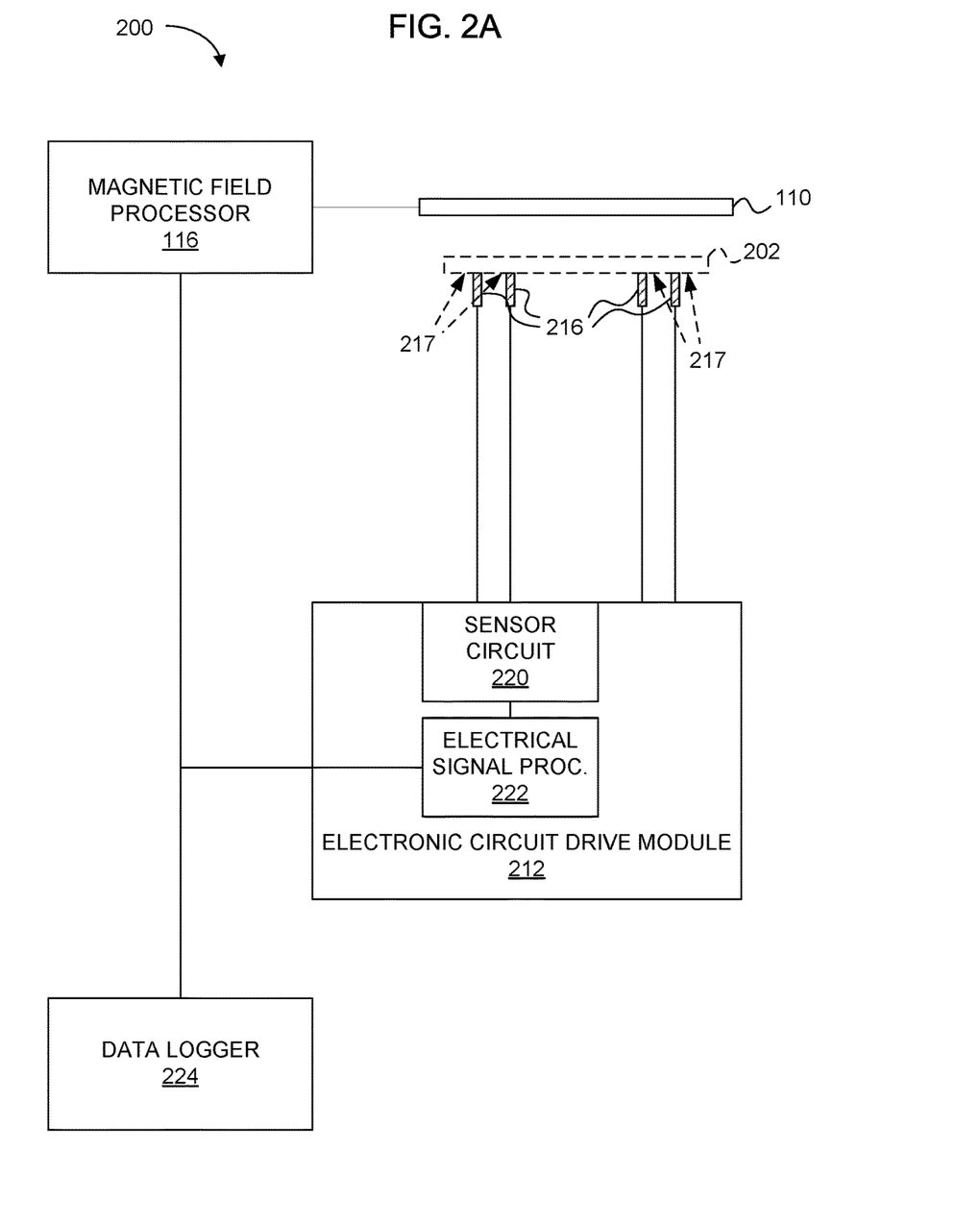
FIG. 2A is a block diagram of a circuit test system, according to an embodiment.

FIG. 2A is a depiction circuit test system 201, according to an embodiment. The circuit test system 200 includes a magnetic sensor array 110 configured to detect magnetic field strengths at a plurality of locations near an assembled electronic circuit 202. A magnetic field processor 116 is included and operatively coupled to receive detected magnetic field strength data from the magnetic sensor array 110 and configured to transform the detected magnetic field strength data into a detected magnetic field pattern 302. A circuit drive module 212 is included and operatively coupled to the assembled electronic circuit 202 and configured to cause a plurality of voltage states to be applied to the assembled electronic circuit 202. The plurality of voltage states are selected to cause the assembled electronic circuit 202 to induce a corresponding plurality of magnetic field states proximate the magnetic sensor array 110. Each magnetic field state corresponds to an instance of the magnetic field strengths at the plurality of locations.

The circuit test system 200 can include a plurality of pins 216 operatively coupled to the circuit drive module 212 and configured to contact the assembled electronic circuit 202. The circuit drive module 212 can be configured to cause the plurality of pins 216 to apply the plurality of voltage states to the assembled electronic circuit 202.

The circuit test system 200 can further include a flying probe operatively coupled to the circuit drive module 212 and configured to sequentially contact a plurality of nodes 217 of the assembled electronic circuit 202. The circuit drive module 212 can be configured to cause the flying probe 216 to apply the plurality of voltage states to the assembled electronic circuit 202.

The assembled electronic circuit 202 can include a native connector 217 configured to receive voltage signals. A test connector can be included and configured to couple to the native connector 217. The circuit drive module 212 can be configured to apply the voltage signals to the assembled electronic circuit 202 via the test connector 216 and the native connector 217.

The assembled electronic circuit 202 can include embedded test circuitry configured to cause the plurality of voltage states to be applied to the assembled electronic circuit 202. The circuit drive module 212 can be configured to transmit commands to the embedded test circuitry to cause the embedded system access circuitry to cause the plurality of voltage states to be applied to the assembled electronic circuit 202.

The circuit drive module 212 can include a sensor circuit 220 configured to sense a plurality of response electrical signal instances from at least one node 217 of the assembled electronic circuit 202, each of the plurality of response electrical signals being produced by the assembled electronic circuit 202 responsive to each of the plurality of voltage states and an electrical signal processor 222 operatively coupled to the sensor circuit 220 and configured to transform the plurality of response electrical signals to a predetermined data format. The predetermined data format can include a boundary scan data format. Additionally or alternatively, the predetermined data format can conform with one or more IEEE 1149.X standards.

The circuit drive module 212 can be configured to receive a plurality of response electrical signal instances from at least one node of the assembled electronic circuit 202, each of the plurality of response electrical signals being produced by the assembled electronic circuit 202 responsive to each of the plurality of voltage states, to transform the plurality of response electrical signals to a predetermined data format, to receive at least one detected magnetic field pattern from the magnetic field processor 116 and to output data corresponding to the response electrical signal predetermined data format and the at least one detected magnetic field pattern to a data logger 210. The data logger 224 can be in the form of an automated test and measurement computer and/or a test and measurement server, for example. The at least one detected magnetic field pattern can include each of the plurality of detected magnetic field patterns.

The circuit drive module 212 can be configured to receive a plurality of response electrical signal instances from at least one node of the assembled electronic circuit 202, each of the plurality of response electrical signals being produced by the assembled electronic circuit 202 responsive to each of the plurality of voltage states and to transform the plurality of response electrical signals to a predetermined data format. The magnetic field processor 116 can be configured to receive the predetermined data format from the circuit drive module 212, combine the predetermined data format with at least one detected magnetic field pattern, and output data corresponding to the response electrical signal predetermined data format and the at least one detected magnetic field pattern to a data logger 224.

FIG. 2A is a depiction circuit test system 200, according to an embodiment. The circuit test system 200 includes a magnetic sensor array 110 configured to detect magnetic field strengths at a plurality of locations near an assembled electronic circuit 202. A magnetic field processor 116 is included and operatively coupled to receive detected magnetic field strength data from the magnetic sensor array 110 and configured to transform the detected magnetic field strength data into a detected magnetic field pattern (see, e.g. FIG. 3 302). A circuit drive module 212 is included and operatively coupled to the assembled electronic circuit 202 and configured to cause a plurality of voltage states to be applied to the assembled electronic circuit 202. The plurality of voltage states are selected to cause the assembled electronic circuit 202 to induce a corresponding plurality of magnetic field states proximate the magnetic sensor array 110. Each magnetic field state corresponds to an instance of the magnetic field strengths at the plurality of locations.

The circuit test system 200 can include a plurality of pins 216 operatively coupled to the circuit drive module 212 and configured to contact the assembled electronic circuit 202. The circuit drive module 212 can be configured to cause the plurality of pins 216 to apply the plurality of voltage states to the assembled electronic circuit 202.

The circuit test system 200 can further include a flying probe 216 operatively coupled to the circuit drive module 212 and configured to sequentially contact a plurality of nodes 217 of the assembled electronic circuit 202. The circuit drive module 212 can be configured to cause the flying probe to apply the plurality of voltage states to the assembled electronic circuit 202.

The assembled electronic circuit 202 can include a native connector 217 configured to receive voltage signals. A test connector can be included and configured to couple to the native connector 217. The circuit drive module 212 can be configured to apply the voltage signals to the assembled electronic circuit 202 via the test connector 216 and the native connector 217.

The assembled electronic circuit 202 can include embedded test circuitry configured to cause the plurality of voltage states to be applied to the assembled electronic circuit 202. The circuit drive module 212 can be configured to transmit commands to the embedded test circuitry to cause the embedded system access circuitry to cause the plurality of voltage states to be applied to the assembled electronic circuit 202.

The circuit drive module 212 can include a sensor circuit 220 configured to sense a plurality of response electrical signal instances from at least one node 217 of the assembled electronic circuit 202, each of the plurality of response electrical signals being produced by the assembled electronic circuit 202 responsive to each of the plurality of voltage states and an electrical signal processor 222 operatively coupled to the sensor circuit 220 and configured to transform the plurality of response electrical signals to a predetermined data format. The predetermined data format can include a boundary scan data format. Additionally or alternatively, the predetermined data format can conform with one or more IEEE 1149.X standards.

The circuit drive module 212 can be configured to receive a plurality of response electrical signal instances from at least one node 217 of the assembled electronic circuit 202, each of the plurality of response electrical signals being produced by the assembled electronic circuit 202 responsive to each of the plurality of voltage states, to transform the plurality of response electrical signals to a predetermined data format, to receive at least one detected magnetic field pattern from the magnetic field processor 116 and to output data corresponding to the response electrical signal predetermined data format and the at least one detected magnetic field pattern to a data logger 224. The data logger 224 can be in the form of an automated test and measurement computer and/or a test and measurement server, for example. The at least one detected magnetic field pattern can include each of the plurality of detected magnetic field patterns.

The circuit drive module 212 can be configured to receive a plurality of response electrical signal instances from at least one node of the assembled electronic circuit 202, each of the plurality of response electrical signals being produced by the assembled electronic circuit 202 responsive to each of the plurality of voltage states and to transform the plurality of response electrical signals to a predetermined data format. The magnetic field processor 116 can be configured to receive the predetermined data format from the circuit drive module 212, combine the predetermined data format with at least one detected magnetic field pattern, and output data corresponding to the response electrical signal predetermined data format and the at least one detected magnetic field pattern to a data logger 224.

The magnetic field processor can be further configured to receive ambient magnetic field data from the magnetic sensor array when a zero voltage state is applied to the assembled electronic circuit, subtract the ambient magnetic field data from the detected magnetic field strength data and transform the magnetic field strength data into a detected magnetic field pattern. Transforming the magnetic field strength data into a detected magnetic field pattern can further include subtracting the ambient magnetic field data from the detected magnetic field strength data.

Figure 2B:
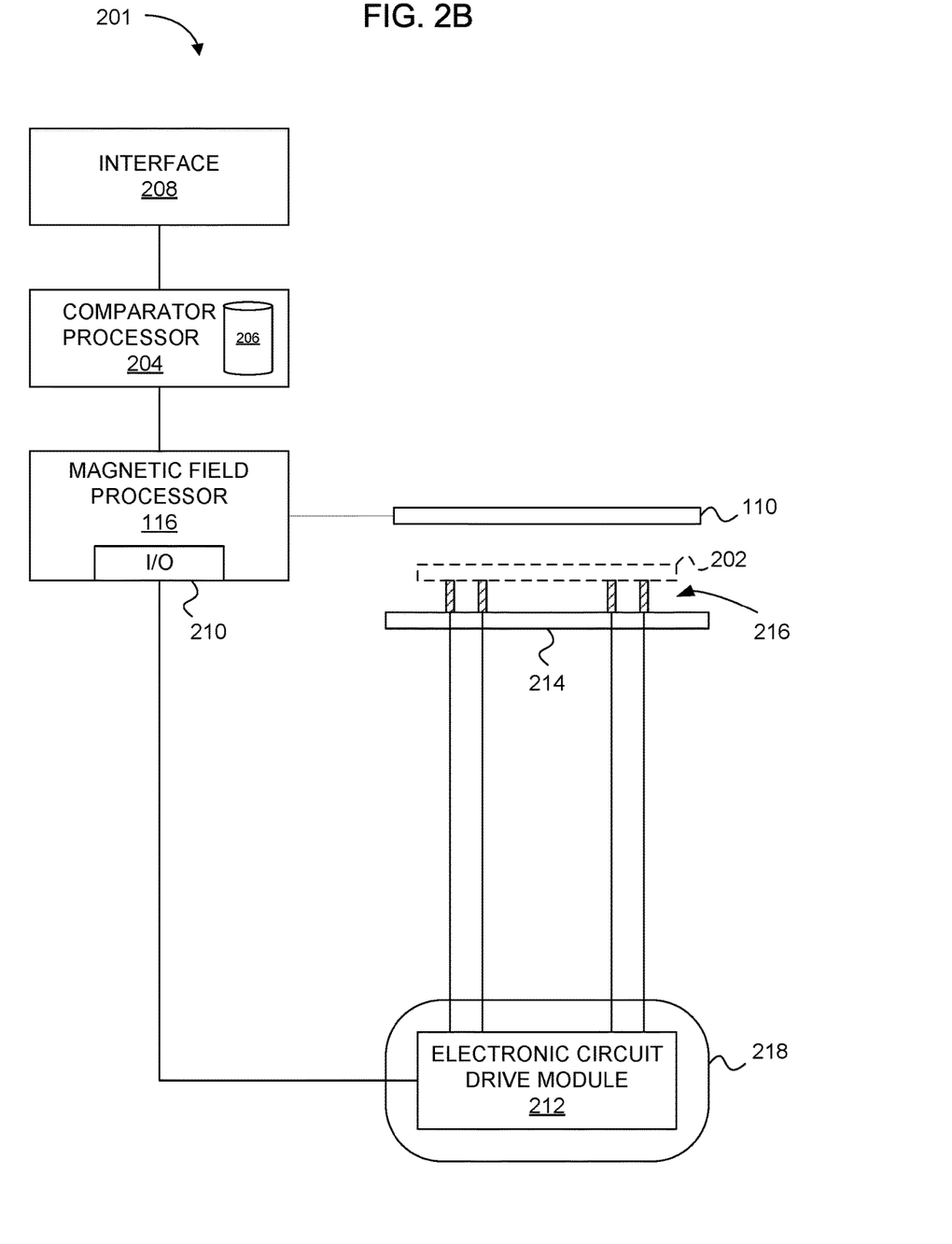
FIG. 2B is a block diagram of a circuit test system, according to another embodiment.

FIG. 2 is a depiction of a circuit test system 200, according to an embodiment. The circuit test system 200 includes a magnetic sensor array 110 configured to detect magnetic field strengths at a plurality of locations near an assembled electronic circuit 202. The circuit test system 200 includes a magnetic field processor 116 operatively coupled to receive magnetic field strength data from the magnetic sensor array 110 and configured to transform the magnetic field strength data into a detected magnetic field pattern. The circuit test system 200 also includes a comparator processor 204 operatively coupled to receive the detected magnetic field pattern from the magnetic field processor 116, to compare the detected magnetic field pattern to at least one reference magnetic field pattern and to output electronic circuit test data indicative of correspondence of the detected magnetic field pattern to the reference magnetic field pattern.

According to an embodiment, the comparator processor 204 includes a non-transitory computer readable medium 206 carrying data corresponding to one or more reference magnetic field patterns. The magnetic field processor 116 can be configured to execute computer instructions carried by a non-transitory computer-readable medium 206 to assemble a first magnetic field pattern corresponding to the assembled electronic circuit 202 and transmit data corresponding to the first magnetic field pattern to the comparator processor 204, according to an embodiment. The comparator processor 204 can be configured to execute computer instructions carried by a non-transitory computer-readable medium 206 to reference one or more stored magnetic field patterns corresponding to a magnetic field pattern tolerance, select a pass condition or a fail condition to assign to the assembled electronic circuit 202, and output the pass or fail condition via an interface 208, according to an embodiment.

According to one embodiment, the magnetic field processor 116 includes a data interface 210 configured to receive an indication of an application of each of a series of voltage states applied to the assembled electronic circuit 202. The magnetic field processor 116 can be configured to issue commands to the magnetic sensor array 110 to detect the magnetic field emissions in time registration with the application of the plurality of voltage states. Additionally, the magnetic field processor 116 can be configured to convert transient magnetic field emissions from the assembled electronic circuit 202 into transient detected magnetic field patterns.

According to an embodiment, the magnetic field processor 116 includes a data interface 210 configured to output a command to control an application of a plurality of voltage conditions to a plurality of pins 216 or pads disposed on the assembled electronic circuit 202. The magnetic field processor 116 is configured to issue commands to the magnetic sensor array 110 to detect the magnetic field emissions in time registration with the application of the plurality of voltage conditions. Additionally, the magnetic field processor 116 can be configured to convert transient magnetic field emissions from the assembled electronic circuit 202 into transient detected magnetic field patterns.

The circuit test system 200 includes an electronic circuit drive module 212 operatively coupled to the magnetic field processor 116 and configured to output a plurality of voltages to the assembled electronic circuit 202, according to an embodiment. The electronic circuit drive module 212 can include a fixture 214 operatively coupled to receive the plurality of voltages from the electronic circuit drive module 212 and configured to output the plurality of voltages on a plurality of pins 216 to the assembled electronic circuit 202. The fixture 214 can be configured to hold the assembled electronic circuit 202 in physical registration with the magnetic sensor array 110. Additionally, the electronic circuit drive module 212 can include a magnetic shield 218 configured to attenuate magnetic field emissions from the electronic circuit drive module 212, according to an embodiment.

According to an embodiment, the comparator processor 204 is configured to compare a plurality of detected magnetic field patterns to a plurality of reference magnetic field patterns 302 (see FIG. 3) corresponding to a plurality of voltage conditions applied to the assembled electronic circuit. The reference magnetic field patterns can correspond to pass or fail conditions for the assembled electronic circuit. The plurality of voltage conditions can include a sequence of voltages applied to the assembled electronic circuit 202.

According to an embodiment, the magnetic sensor array 110 can be configured to detect transient magnetic field emissions from the assembled electronic circuit 202.

The circuit test system 200 can include a magnetic shield 218 having an aperture therethrough configured to exclude magnetic fields from regions of the assembled electronic circuit not positioned in a region corresponding to an aperture in the magnetic shield 218, according to an embodiment. The magnetic shield 218 can include an actuator configured to selectively position the aperture in the magnetic shield 218 proximate each of a plurality of locations relative to the assembled electronic circuit. According to an embodiment, the magnetic field processor 116 can be operatively coupled to the actuator and the comparator processor 204 can be configured to select the reference magnetic field pattern as a function of the location of the aperture in the magnetic shield 218.

Figure 3A:
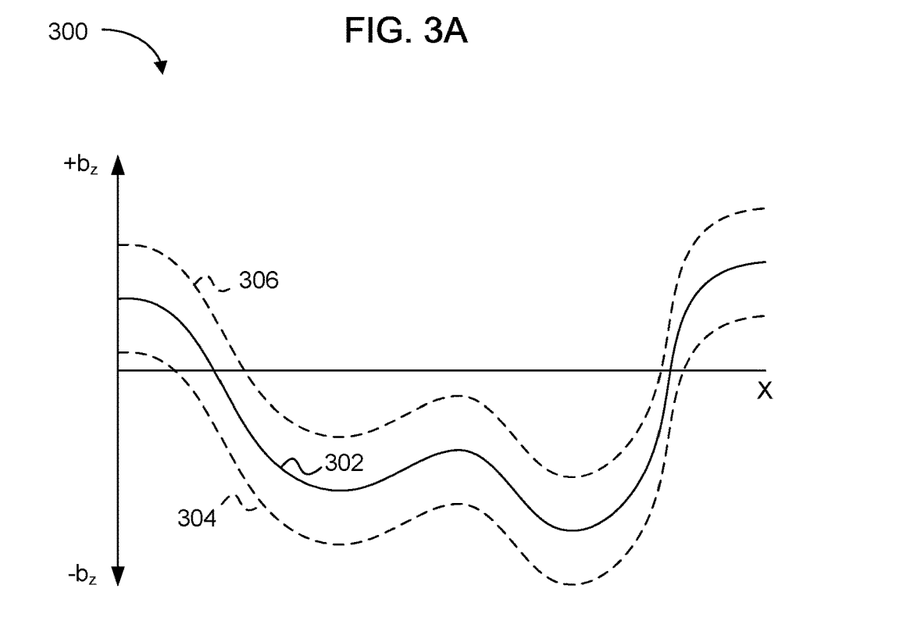
FIG. 3A is a depiction of a comparison of an illustrative detected magnetic field pattern to two illustrative reference magnetic field patterns, according to a condition where the detected magnetic field pattern meets a test criterion, according to an embodiment.

FIG. 3A is a depiction 300 of a comparison of an illustrative detected magnetic field pattern 302 to two illustrative reference magnetic field patterns 304, 306, according to a condition where the detected magnetic field pattern 302 meets a test criterion, according to an embodiment.

Figure 3B:
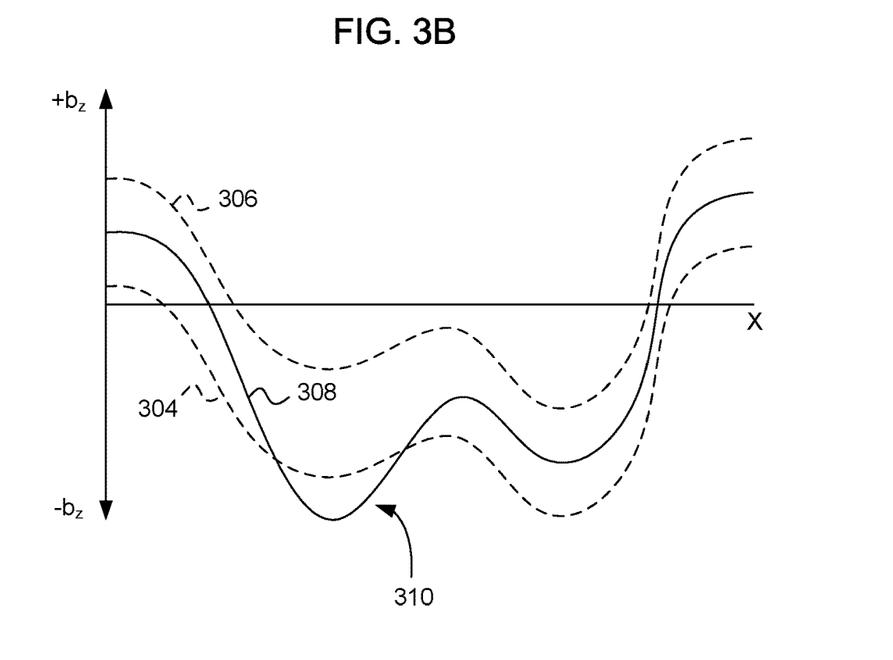
FIG. 3B is a depiction of a comparison of an illustrative detected magnetic field pattern to two illustrative reference magnetic field patterns, according to a condition where the detected magnetic field pattern fails a test criterion, according to an embodiment.

FIG. 3B is a depiction of a comparison of an illustrative detected magnetic field pattern 308 to two illustrative reference magnetic field patterns 304, 306, according to a condition where the detected magnetic field pattern 308, fails a test criterion, according to an embodiment.

According to an embodiment, the reference magnetic field pattern(s) 304, 306 describe a tolerance. The tolerance can act as a test tolerance that correlates to a probability of infant death, OOB failure, shortened service life, or other incipient assembled electronic circuit 202 failure.

According to an embodiment, reference magnetic field pattern(s) 304, 306 include at least two reference magnetic field patterns 304, 306. The reference magnetic field patterns 304, 306 forming threshold failure conditions of the assembled electronic circuit. Alternatively or additionally, the reference magnetic field pattern(s) 304, 306 comprise threshold pass conditions of the electronic circuit. According to an embodiment, the reference magnetic field pattern(s) 304, 306 can comprise a statistically significant combination of detected magnetic field patterns corresponding to previously detected magnetic field patterns 302.

Referring to FIGS. 3A and 3B, magnetic field patterns along one dimension are presented for ease of understanding. It will be understood that the detected and reference magnetic field patterns 302, 304, 306, 308 can be plotted as combinations of magnetic field components (e.g., on X, Y, and Z axes) across a (e.g., (X,Y)) plane or a volume of measurement. The illustrative examples of FIGS. 3A and 3B show the variation of a magnetic field strength B in a single axis, z, across a particular scan of the electronic circuit in an X-axis direction.

The reference magnetic field patterns 304, 306 bound a range of allowable magnetic field strengths for assembled electronic circuits 202 that meet physical and functional requirements. A detected magnetic field pattern 302 in FIG. 3A exhibits magnetic field strengths in the Z-axis ($b_z$) that falls between the bounding provided by the reference magnetic field patterns 304, 306. Accordingly, assuming other scans and other magnetic axes are similarly bounded by corresponding magnetic field patterns, an electronic circuit characterized by the detected magnetic field pattern 302 passes a magnetic field imaging test.

Referring to FIG. 3B, a detected magnetic field pattern 308 for a second electronic circuit, but along a substantially identical scan path, includes a segment 310 that falls outside the bounding provided by the reference magnetic field pattern 304. Accordingly, the second magnetic circuit characterized by the detected magnetic field pattern 308 fails the magnetic field imaging test.

According to embodiments, the comparator processor 204 can compare combinations of magnetic field strengths along plural axes. For example, the magnetic field processor 116 can provide a multiple axis magnetic field pattern by, for each point in a measurement plane or volume, taking a square root of a sum the squares of detected magnetic field strengths along multiple axes. This is expressed as:

$$B=\operatorname{sqrt}(b_x^2+b_y^2+b_z^2),$$

where:
B is the local magnetic field strength,
$b_x$ is the local magnetic field strength along an X-axis,
$b_y$ is the local magnetic field strength along a Y-axis, and
$b_z$ is the local magnetic field strength along a Z-axis.

According to various embodiments, the comparator processor 204 is configured to compare one or more single axis detected magnetic field patterns to one or more corresponding single axis reference magnetic field patterns. The comparator processor 204 can be configured to compare a two-dimensional detected magnetic field pattern to one or more corresponding two dimensional reference magnetic field patterns 304, 306. Additionally, the comparator processor 204 can be configured to perform Boolean logic to determine the data indicative of correspondence of the detected magnetic field pattern 308 to the at least one reference magnetic field pattern 304, 306.

While, the illustrative example of FIGS. 3A and 3B illustrate comparison of a detected magnetic field pattern 302, 308 to two reference magnetic field patterns 304, 306 it will be understood that fewer or more reference magnetic field patterns 304, 306 can be used for the comparison.

According to an embodiment, the at least one reference magnetic field pattern 304, 306 comprises a single reference magnetic field pattern 304, 306. According to another embodiment, the at least one reference magnetic field pattern 304, 306 corresponds to a nominal condition of the assembled electronic circuit.

According to an embodiment, the comparator processor 204 can be configured to determine if the detected magnetic field pattern 302, 308 is statistically similar or dissimilar to the at least one reference magnetic field pattern 304, 306. The electronic circuit test data can be indicative of the correspondence of the detected magnetic field pattern 302, 308 to the at least one reference magnetic field pattern 304, 306 including a value corresponding to the statistical similarity or dissimilarity. According to another embodiment, the comparator processor 204 can be configured to perform Bayesian logic to determine the electronic circuit test data indicative of a correspondence of the detected magnetic field pattern 302, 308 to the at least one reference magnetic field pattern 304, 306. According to another embodiment, the comparator processor 204 can be configured to process data corresponding to physical signals from the magnetic sensor array 110.

In an embodiment, comparison of a detected magnetic field pattern 302, 308 to a single reference magnetic field pattern was conducted by performing a t-test. A plurality of measurements (20 measurements in one example) of a known nominal assembled electronic circuit were performed. The mean value of the measured magnetic field strength was determined for each sensor module in the sensor array. The set of mean magnetic field strength value for each sensor module in the sensor array was treated as a single reference magnetic field pattern. Then, a plurality of measurements (20 measurements in the example) of a known defective assembled electronic circuit were similarly made, and the measured magnetic field strengths averaged for each sensor module in the sensor array. The set of mean magnetic field test value for each sensor module in the sensor array was treated as a detected magnetic field pattern. A t-test was performed for each detector module. The t-test was found to reliably identify a defective assembled electronic circuit. The experiment was repeated several times with assembled electronic circuits having different known defects and was found to repeatably and reliably identify defective assembled electronic circuits.

Referring to FIG. 3B and FIG. 2, it can be seen that an out-or-tolerance magnetic field pattern corresponding to segment 310 can fall at a particular location along the X-axis. By extension, an X, Y location of an out of tolerance segment 310 can be detected. The location of the out of tolerance condition can be determined by the comparator processor 204 and output via the interface 208. Moreover, because a given electronic circuit design has known device and circuit locations, the location of the out-of-tolerance condition can be used to correlate the condition to a failure of a particular portion of or device of the assembled electronic circuit 202.

Figure 4:
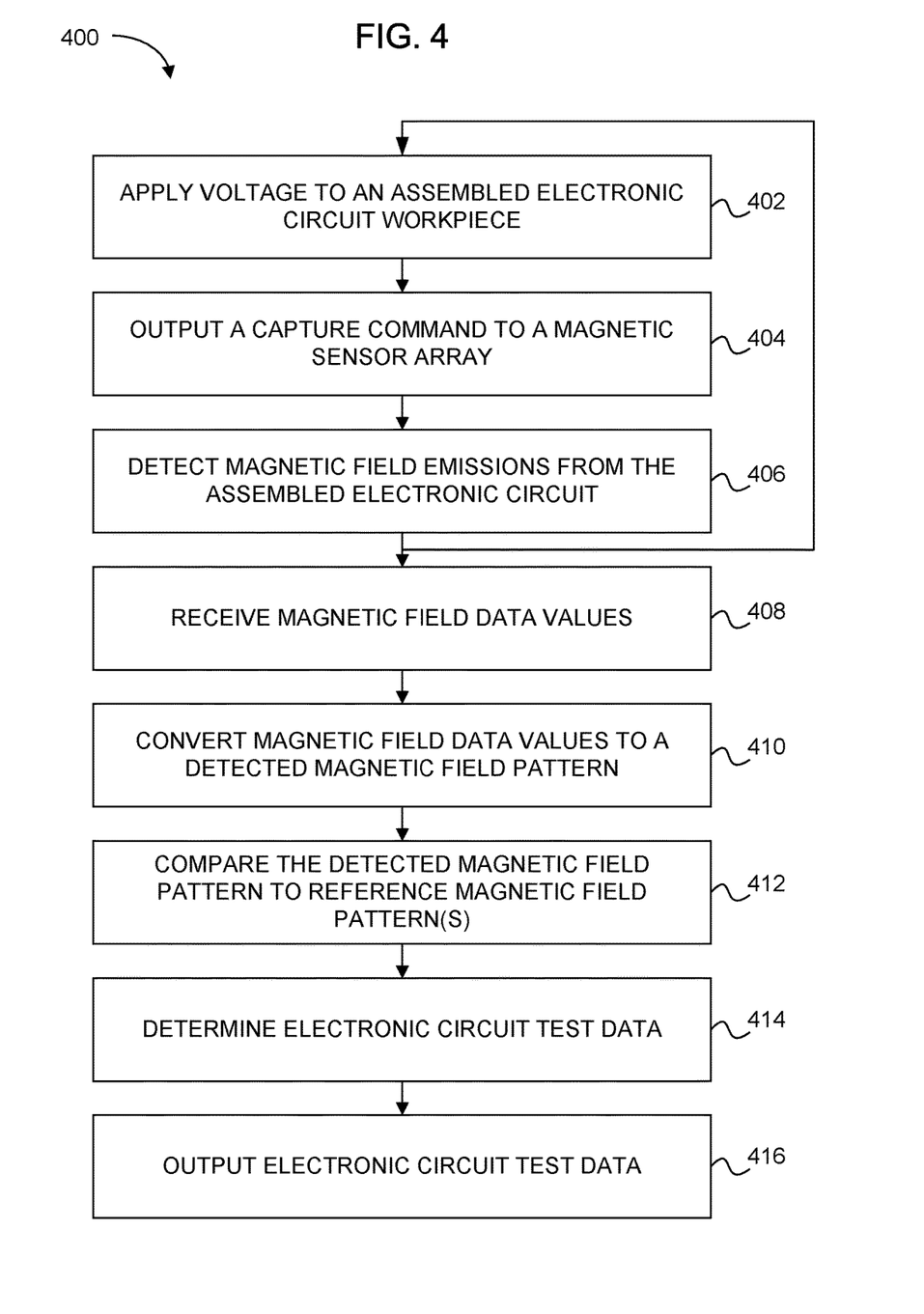
FIG. 4 is a flow chart of a method for testing an electronic circuit, according to an embodiment.

FIG. 4 is a flow chart of a method 400 for testing an electronic circuit, according to an embodiment. The method 400 for testing an electronic circuit includes step 404 wherein computer data corresponding to a capture command is output via a data interface from a controller to a magnetic sensor array arranged to receive magnetic signals output by an assembled electronic circuit. Proceeding to step 408, a plurality of magnetic field data values corresponding to respective magnetic sensors in the magnetic sensor array are received via the data interface. Continuing to step 410, the plurality of magnetic field data values are converted into a detected magnetic field pattern. In step 412 the detected magnetic field pattern is compared to at least one reference magnetic field pattern by a comparator processor. Proceeding to step 416 electronic circuit test data corresponding to the comparison between the detected magnetic field pattern and the reference magnetic field pattern is output via a computer interface.

In step 402 a voltage is applied to the assembled electronic circuit. In step 406, while the voltage is applied to the assembled electronic circuit, a magnetic field emission is detected from the assembled electronic circuit with the magnetic sensor array.

In step 414, electronic circuit test data is determined from the comparison between the detected magnetic field pattern and the reference magnetic field pattern.

According to an embodiment, the method 400 for testing an electronic circuit includes applying a plurality of voltages to a plurality of pins or pads disposed on the assembled electronic circuit. While the plurality of voltages is applied, magnetic field emissions are detected from the assembled electronic circuit.

According to an embodiment, detecting the magnetic field emissions includes detecting a plurality of magnetic field emission states corresponding to the plurality and/or the sequence of applied voltages. According to another embodiment, detecting the plurality of magnetic field emission patterns includes detecting a transient magnetic field pattern. The detected magnetic field pattern can be compared to the to the at least one reference magnetic field pattern by comparing the transient magnetic field emission state to second data sets corresponding to transient a transient voltage applied to the assembled electronic circuit, according to an embodiment.

According to an embodiment, the method 400 for testing an electronic circuit includes actuating a position of an aperture in a magnetic shield proximate each of a plurality of locations on the electronic circuit. Additionally, the method 400 can include selecting the at least one reference magnetic pattern as a function of a location of the aperture in the magnetic shield in a sequence of a plurality of magnetic shield aperture locations, according to an embodiment.

Figure 5:
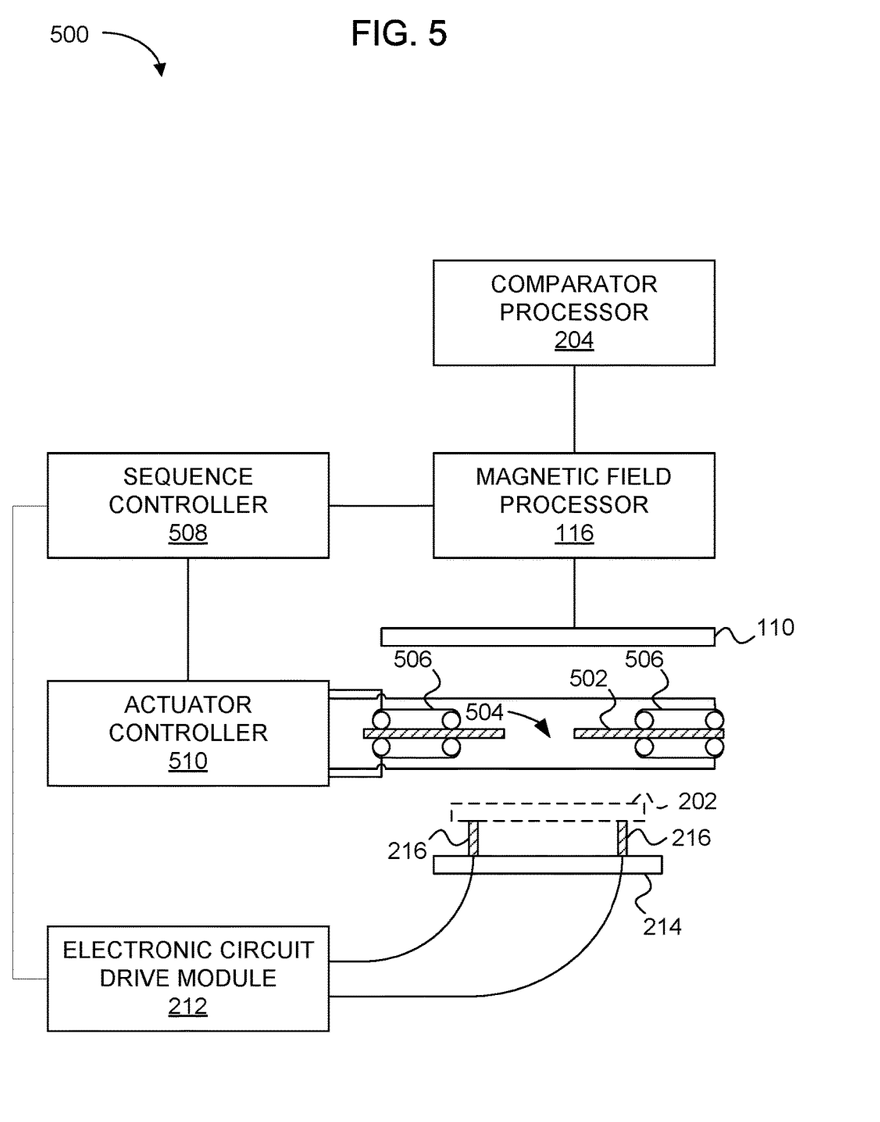
FIG. 5 is a depiction of a magnetic measurement system, according to an embodiment.

FIG. 5 is a depiction of a magnetic measurement system 500, according to an embodiment. The magnetic measurement system 500 includes a magnetic sensor array 110 including a plurality of magnetic field sensing elements. The magnetic measurement system 500 includes a magnetic field processor 116 operatively coupled to the magnetic sensor array 110 and configured to assemble a detected magnetic field pattern (e.g., see FIGS. 3A, 3B, 302, 308) from magnetic sensor array 110 data. The system 500 can optionally include a magnetic shield 502 defining a magnetic aperture 504 formed therethrough, the aperture being positioned to attenuate magnetic field strength formed by regions of an workpiece 202 (e.g., an assembled electronic circuit) not corresponding to the magnetic aperture 504. According to an embodiment, the magnetic shield 502 is formed from mu-metal. The magnetic measurement system 500 can include an actuator 506 operatively coupled to the magnetic shield 502, the actuator 506 being configured to control a position of the magnetic aperture 504.

According to an embodiment, the magnetic measurement system 500 includes a sequence controller 508 operatively coupled to the magnetic field processor 116. An actuator controller 510 can be operatively coupled to the sequence controller 508. At least one actuator 506 is operatively coupled to the actuator controller 510 and to the magnetic shield 502. The sequence controller 508 and actuator controller 510 can be configured to cause the actuator 506 to move the magnetic aperture 504 to a predetermined sequence of positions relative to the magnetic sensor array 110 and the workpiece 202.

According to an embodiment, the magnetic field processor 116 is configured to drive the magnetic field array 110 to measure magnetic field strength corresponding to each of the sequence of magnetic aperture 504 positions.

The magnetic measurement system 500 can include an electronic circuit drive module 212 operatively coupled to the sequence controller 508. A fixture 214 can be configured to hold the workpiece 202. The fixture 214 can include a plurality of pins 216 operatively coupled to the electronic circuit drive module 212. According to an embodiment, the electronic circuit drive module 212 can be configured to drive the plurality of pins 216 to apply two or more voltages to the assembled electronic circuit 202 while the magnetic aperture 504 is held at each of a plurality of locations in a sequence of locations.

Figure 6:
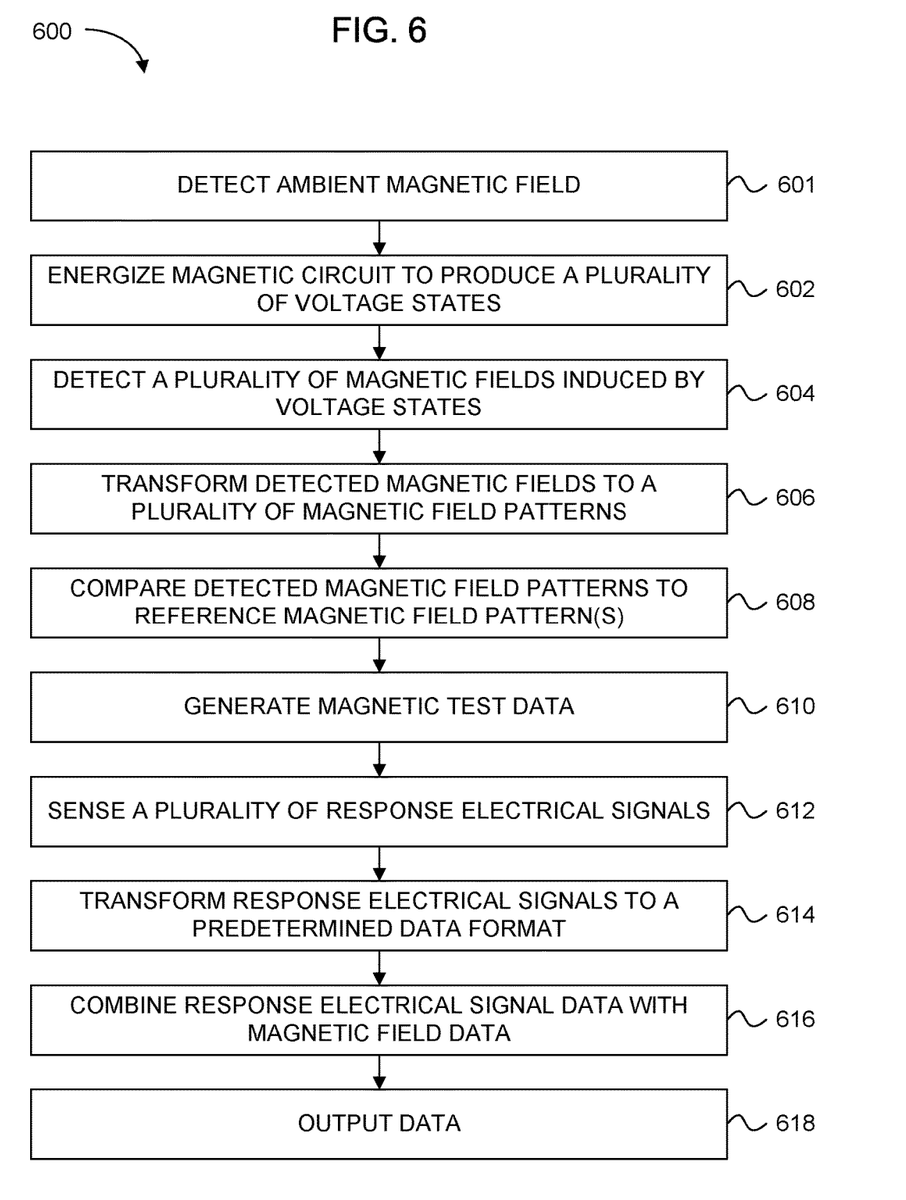
FIG. 6 is a flow chart showing a method for operating a circuit test system, according to embodiments.

FIG. 6 is a flow diagram of a method 600 for operating a circuit test system according to an embodiment. The method includes step 602 an assembled electronic circuit to a plurality of voltage states is energized to cause the assembled electronic circuit to induce a corresponding plurality of magnetic fields. The method also includes step 604 each of the plurality of magnetic fields at a plurality of locations is detected with a magnetic sensor array to produce a corresponding plurality of detected magnetic field strength data sets. The method further includes step 618 at least one detected magnetic field strength data set is output to a data logger.

In an embodiment, energizing the assembled electronic circuit can include applying the plurality of voltage states to a plurality of conductor pads on the assembled electronic circuit via a corresponding plurality of pins. Energizing the assembled electronic circuit can include applying the plurality of voltage states to a plurality of nodes on the assembled electronic circuit to via a flying probe. Additionally or alternatively, energizing the assembled electronic circuit can include applying the plurality of voltage states to an embedded test circuit forming a portion of the assembled electronic circuit. Energizing the assembled electronic circuit can include transmitting commands to a logic device carried by the assembled electronic circuit and energizing embedded test circuitry responsive to operation of the logic device.

The method 600 can further include step 612 a plurality of response electrical signal instances from at least one node of the assembled electronic circuit are sensed and step 614 the plurality of response electrical signal instances are transformed to a predetermined data format. Transforming the plurality of response electrical signal instances to a predetermined data format can include transforming the plurality of response electrical signal instances to a boundary scan data format. Additionally or alternatively, transforming the plurality of response electrical signal instances to a predetermined data format can include transforming the plurality of response electrical signal instances to a data format that conforms to one or more IEEE 1149.X standards.

In an embodiment, the method 600 can further include step 616 the response electrical signal predetermined data format is combined with the at least one detected magnetic field strength data set prior to transmitting the combined data to a data logger.

In an embodiment, the method 600, can further include step 601 an ambient magnetic field is detected at each of the plurality of locations with the assembled electronic circuit not energized, as an ambient magnetic field data set. Continuing to step 618 the at least one magnetic field data set is output to a data logger. Step 618 includes also outputting the ambient magnetic field data set.

In another embodiment, a method 600 for operating a circuit test system includes step 602 an assembled electronic circuit to a plurality of voltage states is energized to cause the assembled electronic circuit to induce a corresponding plurality of magnetic fields. The method also includes step 604 each of the plurality of magnetic fields at a plurality of locations is detected with a magnetic sensor array to produce a corresponding plurality of detected magnetic field strength data sets. The method further includes 606 each of the magnetic field strength data sets is transformed into a corresponding detected magnetic field pattern. Continuing to step 618 at least one of the detected magnetic field patterns is out put to a data logger.

In an embodiment, energizing the assembled electronic circuit can include applying the plurality of voltage states to a plurality of conductor pads on the assembled electronic circuit via a corresponding plurality of pins. Energizing the assembled electronic circuit can include applying the plurality of voltage states to a plurality of nodes on the assembled electronic circuit to via a flying probe. Additionally or alternatively, energizing the assembled electronic circuit can include applying the plurality of voltage states to an embedded test circuit forming a portion of the assembled electronic circuit. Energizing the assembled electronic circuit can include transmitting commands to a logic device carried by the assembled electronic circuit and energizing embedded test circuitry responsive to operation of the logic device.

The method 600 can further include step 612 a plurality of response electrical signal instances from at least one node of the assembled electronic circuit are sensed and step 614 the plurality of response electrical signal instances are transformed to a predetermined data format. Transforming the plurality of response electrical signal instances to a predetermined data format can include transforming the plurality of response electrical signal instances to a boundary scan data format. Additionally or alternatively, transforming the plurality of response electrical signal instances to a predetermined data format can include transforming the plurality of response electrical signal instances to a data format that conforms to one or more IEEE 1149.X standards.

In an embodiment, the method 600 can further include step 616 the response electrical signal predetermined data format is combined with the at least one detected magnetic field strength data set prior to transmitting the combined data to a data logger.

In an embodiment, the method 600 can include step 601 an ambient magnetic field strength is detected at each of the plurality of locations with the assembled electronic circuit not energized. Continuing to step 606 each of the magnetic field strength data sets is transformed into a corresponding detected magnetic field pattern. Step 606 can include compensating for the ambient magnetic field. Compensating for the ambient magnetic field can include, for each location, subtracting the ambient magnetic field from the corresponding detected magnetic field strength.

In another embodiment, the method 600 for operating a circuit test system, includes step 602 an assembled electronic circuit to a plurality of voltage states is energized to cause the assembled electronic circuit to induce a corresponding plurality of magnetic fields. The method also includes step 604 each of the plurality of magnetic fields at a plurality of locations is detected with a magnetic sensor array to produce a corresponding plurality of detected magnetic field strength data sets. Proceeding to step 606, each of the detected magnetic field strength data sets is transformed into a corresponding detected magnetic field pattern. In step 608 each of the detected magnetic field patterns is compared to one or more reference magnetic field patterns. Continuing to step 610 electronic circuit magnetic test data indicative of correspondence of the detected magnetic field patterns is generated to the one or more reference magnetic field patterns and in step 618 oat least one magnetic test data set is output to a data logger.

In an embodiment, energizing the assembled electronic circuit can include applying the plurality of voltage states to a plurality of conductor pads on the assembled electronic circuit via a corresponding plurality of pins. Energizing the assembled electronic circuit can include applying the plurality of voltage states to a plurality of nodes on the assembled electronic circuit to via a flying probe. Additionally or alternatively, energizing the assembled electronic circuit can include applying the plurality of voltage states to an embedded test circuit forming a portion of the assembled electronic circuit.

Energizing the assembled electronic circuit can include transmitting commands to a logic device carried by the assembled electronic circuit and energizing embedded test circuitry responsive to operation of the logic device.

The method 600 can further include step 612 a plurality of response electrical signal instances from at least one node of the assembled electronic circuit are sensed and step 614 the plurality of response electrical signal instances are transformed to a predetermined data format. Transforming the plurality of response electrical signal instances to a predetermined data format can include transforming the plurality of response electrical signal instances to a boundary scan data format. Additionally or alternatively, transforming the plurality of response electrical signal instances to a predetermined data format can include transforming the plurality of response electrical signal instances to a data format that conforms to one or more IEEE 1149.X standards.

In an embodiment, the method 600 can further include step 616 the response electrical signal predetermined data format is combined with the at least one detected magnetic field strength data set prior to transmitting the combined data to a data logger.

In an embodiment, the method 600 can further include step 601 an ambient magnetic field strength is detected at each of the plurality of locations with the assembled electronic circuit not energized. Continuing to step 606 each of the magnetic field strength data sets is transformed into a corresponding detected magnetic field pattern. Step 606 includes compensating for the ambient magnetic field. Compensating for the ambient magnetic field can include, for each location, subtracting the ambient magnetic field from the corresponding detected magnetic field strength.

While various aspects and embodiments have been disclosed herein, other aspects and embodiments are contemplated. The various aspects and embodiments disclosed herein are for purposes of illustration and are not intended to be limiting, with the true scope and spirit being indicated by the following claims.

What is claimed is:

1. A method for testing an electronic circuit, comprising:
    outputting, via a data interface, a capture command to a magnetic sensor array arranged to receive magnetic signals output by an assembled electronic circuit;
    receiving, via the data interface, a plurality of magnetic field data values corresponding to respective magnetic sensors in the magnetic sensor array;
    converting the plurality of magnetic field data values into a detected magnetic field pattern;
    comparing the detected magnetic field pattern to at least one reference magnetic field pattern;
    outputting electronic circuit test data corresponding to the comparison between the detected magnetic field pattern and the reference magnetic field pattern;
    applying a voltage to the assembled electronic circuit; and
    while applying the voltage to the assembled electronic circuit, detecting a magnetic field emission from the assembled electronic circuit with the magnetic sensor array.

2. The method for testing an electronic circuit of claim 1, further comprising:
    determining electronic circuit test data from the comparison between the detected magnetic field pattern and the reference magnetic field pattern.

3. A method for testing an electronic circuit, comprising:
    outputting, via a data interface, a capture command to a magnetic sensor array arranged to receive magnetic signals output by an assembled electronic circuit;
    receiving, via the data interface, a plurality of magnetic field data values corresponding to respective magnetic sensors in the magnetic sensor array;
    converting the plurality of magnetic field data values into a detected magnetic field pattern;
    comparing the detected magnetic field pattern to at least one reference magnetic field pattern;
    outputting electronic circuit test data corresponding to the comparison between the detected magnetic field pattern and the reference magnetic field pattern;
    applying a plurality of voltages to a plurality of pins or pads disposed on the assembled electronic circuit; and
    while applying the plurality of voltages, detecting magnetic field emissions from the assembled electronic circuit.

4. The method for testing an electronic circuit of claim 3, wherein applying the plurality of voltage conditions includes applying a plurality of voltages to one or more of the pins or pads; and
    wherein detecting the magnetic field emissions includes detecting a plurality of magnetic field emission states corresponding to the plurality of applied voltages.

5. The method for testing an electronic circuit of claim 3, wherein applying the plurality of voltage conditions includes applying a sequence of voltages to the pins or pads; and
    wherein detecting the magnetic field emissions includes detecting a plurality of magnetic field emission patterns corresponding to the sequence of applied voltages.

6. The method for testing an electronic circuit of claim 5, wherein detecting the plurality of magnetic field emission patterns includes detecting a transient magnetic field pattern.

7. The method for testing an electronic circuit of claim 6, wherein comparing the detected magnetic field pattern to the at least one reference magnetic field pattern includes comparing the transient magnetic field emission state to second data sets corresponding to a transient voltage applied to the assembled electronic circuit.

8. The method for testing an electronic circuit of claim 3, further comprising:
    determining the electronic circuit test data from the comparison between the detected magnetic field pattern and the reference magnetic field pattern.

* * * * *